United States Patent

Pascucci

[11] Patent Number: 5,850,361
[45] Date of Patent: Dec. 15, 1998

[54] PROGRAMMABLE MEMORY WITH SINGLE BIT ENCODING

[75] Inventor: Luigi Pascucci, Sesto S. Giovanni, Italy

[73] Assignee: SGS-Thomson Microelectronics S.r.l., Milan, Italy

[21] Appl. No.: 628,587

[22] Filed: Apr. 4, 1996

[30] Foreign Application Priority Data

Apr. 4, 1995 [EP] European Pat. Off. ............. 95830133

[51] Int. Cl.[6] .................................................. G11C 16/04
[52] U.S. Cl. .................................. 365/185.18; 365/185.21
[58] Field of Search ........................... 365/185.21, 185.18

[56] References Cited

U.S. PATENT DOCUMENTS

| | | | |
|---|---|---|---|
| 4,514,830 | 4/1985 | Hagiwara et al. | 365/185.09 |
| 4,546,454 | 10/1985 | Gupta et al. | 365/200 |
| 4,807,188 | 2/1989 | Casagrande | 365/185.05 |
| 4,860,260 | 8/1989 | Saito et al. | 365/201 |
| 5,153,854 | 10/1992 | Herold | 365/185.18 |
| 5,300,840 | 4/1994 | Drouot | 327/51 |
| 5,463,586 | 10/1995 | Chao et al. | 365/210 |
| 5,491,656 | 2/1996 | Sawada | 365/185.29 |
| 5,559,742 | 9/1996 | Lee et al. | 365/200 |
| 5,561,621 | 10/1996 | Devin et la. | 365/49 |
| 5,644,529 | 7/1997 | Pascucci et al. | 365/185.05 |

FOREIGN PATENT DOCUMENTS

| | | |
|---|---|---|
| 0058049 | 8/1982 | European Pat. Off. . |
| 0249903 | 12/1987 | European Pat. Off. . |
| 91 03054 | 7/1991 | WIPO . |

OTHER PUBLICATIONS

Oto et al., "A high speed EEPROM configurable digital to analog converter array," Proc IEE Custom Integrated Circuits Conference, 13–16 May, 1990, Boston, pp. 6.6.1–6.6.5.

Watts, "Unique cell design gives high EEPROM endurance," Electronic Engineering, vol. 64, No. 787, Jul. 1992, London, pp. 43–46.

*Primary Examiner*—David Nelms
*Assistant Examiner*—Hoal V. Ho
*Attorney, Agent, or Firm*—Allen, Dyer, Doppelt, Milbrath & Gilchrist, P.A.

[57] ABSTRACT

A coding device including an array of multibit registers, each being composed of a plurality of programmable nonvolatile memory cells connected to an OR configuration to a common sensing line of the register to which a single reading circuit is associated. A first, select/enable bus (SELbus) controls the connection of only one at a time of said programmable memory cells to said common sensing line of each multibit register. To each wire of a second, configuring bus (CODE bus) are connected in common the current terminals of as many programming transistors as the memory cells that compose each register, and to each wire of a third, contingently programming bus (PG bus) are connected the gates of the programming transistors of memory cells of the same order of said registers.

15 Claims, 3 Drawing Sheets

PROGRAMMABLE MEMORY WITH SINGLE BIT ENCODING

BACKGROUND AND SUMMARY OF THE INVENTION

The present invention relates in general to logic coding circuits for implementing redundancy systems, substituting circuit blocks, modifying a data flow, changing the function performed by a certain integrated circuit or the like.

Concurrently with the development of integration technologies that allow to "compact" in single chip ever more complex and/or diversified systems, eventually with the ability of being subsequently adapted to particular specifications of users, a need has arisen for implementing in the same integrated circuit redundancy systems and/or special circuits that though a programming performed on the finished device, permit to replace and/or modify particular functions of certain integrated circuits and/or modifying the circuit flows. These redundancy, configuration/reconfiguration facilities permit to recover an appropriate performance of the integrated device, fully meeting the specs after detection of a defect of an intervening failure of circuit component, thus preventing the often non-negligible economic loss of discarding the whole device. Of course, these configuration/reconfiguration circuits may also allow to adapt a certain device to particular requirements of the user, thus making possible a great saving in terms of design and fabrication of devices covering diversified requirements. Complex optimization evaluations of the design of new devices, take into consideration statistical data pertaining to the particular fabrication process in order to determine an optimum cost/benefit ratio in defining the total number of these redundancy/configuration/reconfiguration circuits to be implemented in a certain integrated device. The cost is represented by the silicon area to be destined to these circuits. A typical application of these circuits is represented by the redundancy systems of read only memory arrays. It is evident that for fabricating memory devices with ever increasing capacities (for example 16 Mbit memory devices), it would be an intolerable economic hazard to be obliged to discard the device because of the failure or erratic performance of a single bit. In these, as well as in innumerable similar situations, it is mandatory from an economic point of view, to design and implement in the same device, a certain number of spare bitlines and wordlines to be used (to be addressed) in substitution of one or more bitlines or wordlines found to be defective by a dedicated control circuitry and therefore substitute them with an equal number of spare (redundant) lines.

In these redundancy systems, as well as in other similar systems for configuring or reconfiguring a certain integrated circuit in order to modify the data stream, beside recognizing the need to implement a certain modification, it is necessary to establish in an unequivocal way the identification of the pertinent circuit section or the identification of the chosen alternative path.

Such an identification may be implemented in a direct manner in relatively simple situations or in a coded form, that is in a intrinsically more powerful but relatively complex manner. Recourse to a coding is necessary especially in applications where the circuit blocks that are designed for an eventual modification of the path of the data stream therethrough are relatively numerous and/or when the locations at which an intervening need of modifying a certain path is recognized and signaled, are physically far away from the circuit blocks in which the path modification must be implemented.

In these situations, the coding is performed at the locations where the need of a certain modifying intervention is recognized and, through a "contained bus" structure, the codes so generated are decoded in the circuit blocks where the modification will be implemented.

According to a traditional architecture, a state or logic configuration corresponding to a certain contingent code that identifies for example the existence of a failure in a certain bitline or in a certain wordline of a memory cell array, is permanently recorded (programmed) in one or more nonvolatile memory elements which are read continuously. The code that results from the reading of information thus stored, and which identifies for example a certain redundant bitline or wordline onto which the data stream must be readdressed every time the bitline or wordline that has been recognized as failed is stimulated, is eventually enabled to be decoded at a distance by a dedicated local decoding network in order to produce its effect at a certain circuit junction so identified by the code.

The writing of each nonvolatile memory element must be produced by appropriately biasing the control gate and the drain of the nonvolatile memory element, employing programming circuits that can be stimulated by contingent conditions, according to a general scheme as shown in FIG. 1.

Substantially, a coding unit cell is commonly composed substantially by three transistors or similar devices: a memory cell M, which may be a FLASH-EPROM or EEPROM cell, a programming transistor Mp and a select transistor Ms, respectively. The three devices are controlled through three configuring lines, typically: a DATA CODE line, a PGcnt and VDcnt line and a code enable CODE EN line, respectively, as shown in the scheme of FIG. 1.

The managing circuits of the unitary register or cell composed of the three devices M, Mp and Ms, are schematically indicated in FIG. 1 by respective blocks. These comprise a circuit for generating a programming voltage VP GEN, a circuit for generating a programming voltage PG HV GEN, a circuit for generating a programming voltage for the control gate of the memory element M CG HV GEN, a circuit for generating a read biasing voltage RD VOLTAGE, a circuit for generating a control voltage for the select transistor VD VOLTAGE GEN, as well as a reading circuit of the state of the nonvolatile memory element DET CIRCUIT.

The nonvolatile memory element M is read continuously and by the enable signal CODE EN, a certain effect of readdressing may be produced by a local decoding circuit at a certain location of the integrated circuit.

Of course, in case of systems requiring a multibit coding, it is common practice to constitute multibit registers by employing the required number of unit register (cells) as the one schematically depicted in FIG. 1.

As may be observed, each unit cell of a multibit register includes its own reading circuit (DET CIRCUIT) as well as an enabling circuit, which must therefore be modularly repeated a number of times equal to the number of bits of the coding register.

There is therefore a need and/or utility for a programmable register for coding purposes having a simpler structure than the known registers.

These and other objectives that will be identified in the ensuring description are obtained by the present invention that offers important advantages if compared with the known architectures.

According to a first aspect of the invention, an elementary coding structure comprises at least a nonvolatile memory element capable of assuming and/or retaining a state corresponding to a certain binary code by eventually programming it through a programming transistor which has a current terminal connected to a coding line and a gate controlled by a contingent programming signal which controls also the biasing of a control gate of the nonvolatile memory element. By contrast, a select transistor is controlled through its gate terminal by a signal that enables the reading of the state of the nonvolatile memory element.

Therefore, the elementary coding cell is controlled through just two "configuring" lines and a "customizing" line (i.e. the read enabling line).

Programming of the nonvolatile memory element may take place by applying a relatively high voltage to its control gate as well as to the gate of the programming transistor. By applying a logic high signal to the current terminal (drain terminal) of the programming transistor through the coding line a permanent increase of its threshold may be produced (setting it in a nonconductive state); and conversely, by applying a logic low signal, the threshold of the virgin memory element is kept low (setting it in a state).

The reading of the state of the memory element may take place only by enabling it through a relative select/enable transistor.

This architecture of elementary coding cell permits to form multibit registers that advantageously employ a single reading circuit, by permitting the connection in an OR configuration of all the elementary cells that compose the multibit register to a single sensing line common to all the cells of the register. This greatly simplifies the circuit, saves integration area and reduces current consumption.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 2:
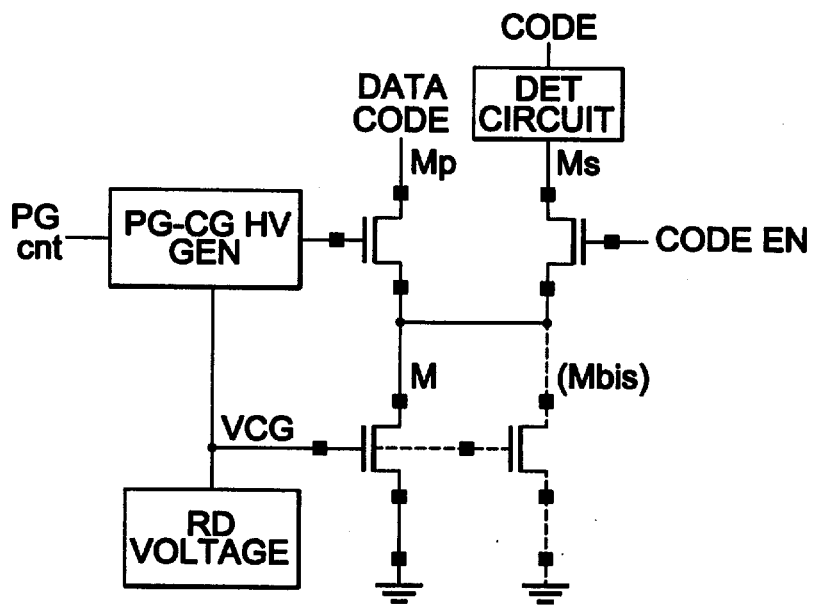
FIG. 2 is a basic diagram of an elementary coding cell according to the present invention.

The numerous innovative teachings of the present application will be described with particular reference to the presently preferred embodiment (by way of example, and not of limitation), in which:

With reference to FIG. 2, an elementary coding cell (fuse) of the invention, is basically composed of three elements: a nonvolatile memory element or transistor M which may be a FLASH-EPROM or an EEPROM cell or the like, a programming transistor Mp and a select-enable transistor Ms. Of course, the nonvolatile memory element may be single or composed of several elements connected in parallel with each other, preferably in a maximum number of two, as indicated in FIG. 2 by phantom (dash) lines and by the symbol of a second nonvolatile memory element Mbis.

The block PG-GC-HV-GEN represents a common circuit for generating a programming voltage suitable to properly bias the gate of the programming transistor Mp and the control gate of the nonvolatile memory element(s) M (Mbis) in response to a contingent programming command Pgcnt.

A current terminal (drain) of the programming transistor Mp, which is functionally connected in series with the memory element M (or duplicated elements M and Mbis), is connected to a second configuring line, DATA CODE, carrying the datum to be stored in the nonvolatile memory element M (or in M and Mbis).

A select-and-enable transistor Ms is normally in an off condition and turns on in response to an enable signal, CODE EN, eventually applied to its control gate for enabling the reading of the information stored in the memory element M (Mbis) and thus generating a certain logic code (CODE) by means of a reading circuit DET CIRCUIT.

The block RD VOLTAGE represents a common circuit for maintaining a correct reading bias on the control gate of the memory element M or elements M and Mbis.

Figure 3:
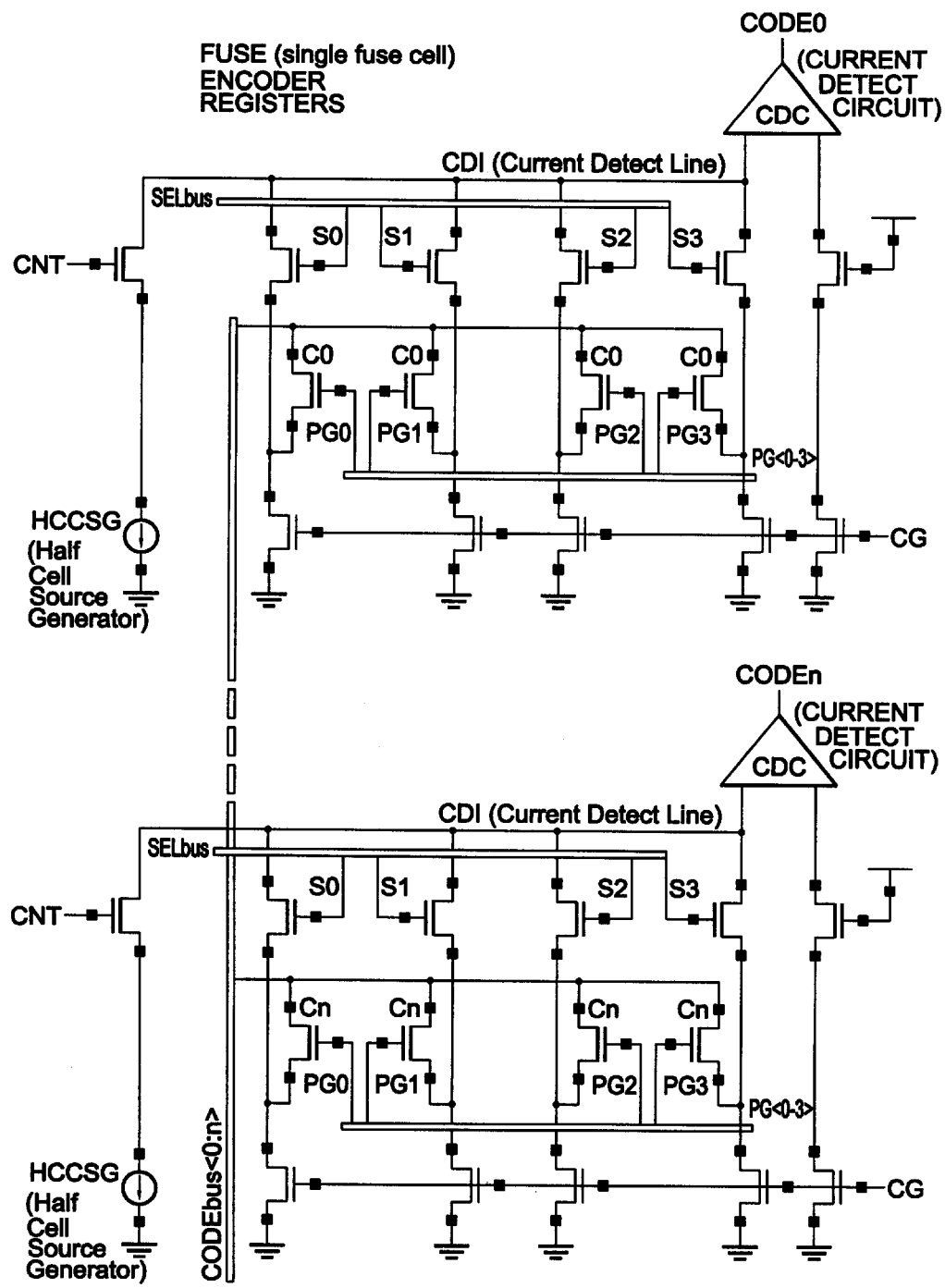
FIG. 3 schematically shows a coding system employing a plurality of multibit registers made according to the present invention.

A system for generating a code composed by an n+1 number of bits is shown in a simplified manner in FIG. 3. The generated multibit code may then be decoded at the location where a certain readdressing should be eventually produced.

The coding system employs the same number n+1 of multibit registers which in the example shown are four-bit registers made according to the present invention.

Figure 1:
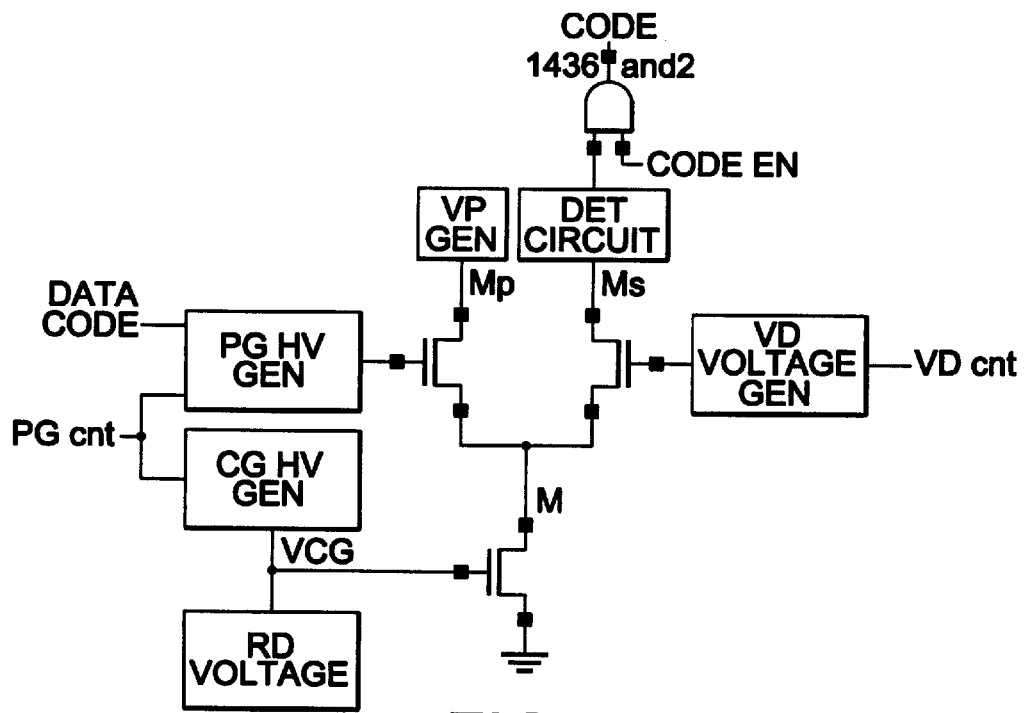
FIG. 1 is a basic diagram of an elementary coding cell according to a known technique.

An enable (customizing) command, that is the CODE EN signal of FIGS. 1 and 2, is applied to the four elementary cells that compose each of the n+1 registers through the select-enable bus SELbus<0:n>. Similarly, the programming transistor of each of the four elementary cells that compose each of the n+1 registers is controlled through its gate by a contingent programming command: PG0, PG1, PG2 and PG3 through the bus PG<0:3>.

The drains of the four programming transistors of each multibit register are connected in common to a respective wire of the n+1 wires of the configuring CODE BUS <0:n>.

According to the shown example, the four elementary cells that compose each of the n+1 registers are connected in an OR configuration to a common sensing line CDL that constitutes an input node of a single reading circuit associated to each one of the n+1 registers.

The common sensing line CDL of each multibit register constitutes the input of a reading circuit that may be of a differential type (as shown in the figure) or even of a single-ended type. According to well known techniques, the reading circuit or sense amplifier, may employ a reference system that may be of various types; for example it may be of the so-called load-unbalance type (UCDC) or of the type employing a dedicated generator of a certain offset current, commonly a current that is twice or a half of the current absorbed by a virgin nonvolatile memory element (CDC).

In the case depicted in FIG. 3, the single reading circuit CDC of each register is of a differential type, employing a reference line and a generator HCCSG of an offset current (half-cell source generator) and a control switch commanded by the CNT signal.

The select/enable bus SELbus, through which the reading of the stored data (and consequently the generation and decoding at a distance of the produced code), may have only one line of its four lines of the example shown, namely: S0, S1, S2 and S3 in FIG. 3, at a logic high level ("1"). Therefore, in case two or more codes must be generated simultaneously, it is necessary to repeat the selection relative to the second and eventual further configurations.

In other words, each line or wire of the select bus SELbus connects one and only one bit of each register to the common sensing node CDL of the register.

The set of states of the n+1 sense amplifiers (CDC) constitutes the configuration of the stored code, which will be decoded at distance in the location where a certain modification of the data stream or of the functions of a certain circuit must be produced.

Figure 4:
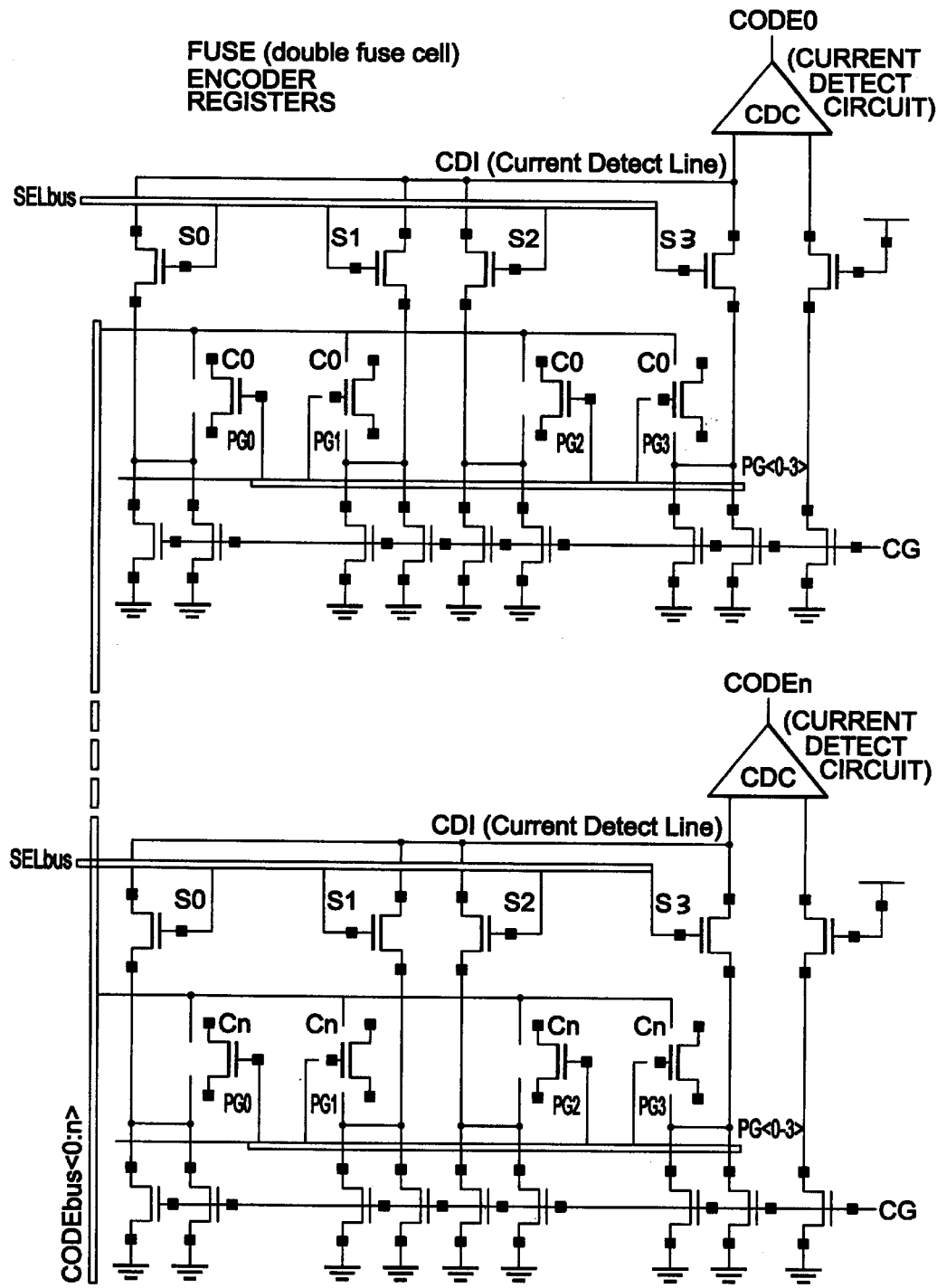
FIG. 4 shows an alternative embodiment of a coding system employing a plurality of multibit registers according to the present invention.

An alternative embodiment of an array of coding registers similar to the one of the example of FIG. 3 is shown in FIG. 4.

According to this alternative embodiment, each elementary cell of each multibit register employs a pair of nonvolatile memory elements connected in parallel and each register employs a differential type sense amplifier UCDC of the unbalanced-load type, according to a well known technique.

The reduction of the number of configuring and enabling lines that are substantially three instead of four as in the known systems, and the consequent simplification of the control circuitry, together with the use of a single sense amplifier for each multibit register, determine a remarkable reduction of the area requirement and of consumption. These advantages become more and more important the larger is the number of codes and of the set of decoding sections to be realized.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. A coding device comprising an array of multibit registers each composed of a plurality of programmable nonvolatile memory cells characterized in that:
   said programmable elementary cells of each register are functionally connected in an OR configuration to a common sensing line of the multibit register, and including programming transistors having current terminals and gates;
   a single reading circuit is associated to each multibit register and has an input connected to said common sensing line;
   said device further comprising a first select/enable bus for connecting a single elementary programmable cell of the same order of each multibit register at one time to said common sensing line of the respective register;
   a second configuring bus to each wire of which are connected the current terminals of the programming transistors of all programmable elementary cells that compose each register;
   a third contingent programming bus, to each wire of which are connected the gates of the programming transistors of the memory cells of the same order of said registers.

2. The coding device according to claim 1, wherein said nonvolatile memory element is a FLASH-EPROM.

3. The coding device according to claim 1, wherein said nonvolatile memory element is an EEPROM.

4. The coding device according to claim 1, wherein said programmable elementary cell is comprised of MOS devices.

5. The coding device according to claim 1, wherein said programmable elementary cell comprises a plurality of nonvolatile memory elements functionally connected in parallel with each other.

6. A fuse encoding structure comprising:
   at least one programmable nonvolatile memory element;
   a programming transistor functionally connected in series with said nonvolatile memory elements;
   a select-enable transistor functionally connected in series with said nonvolatile memory element and in parallel with said programming transistor; and
   a common programming circuit operatively connected to said programming transistor and said nonvolatile memory element for controlling said programming transistor and nonvolatile memory element.

7. The fuse encoding structure of claim 6, wherein said nonvolatile memory element is a FLASH-EPROM.

8. A fuse encoding structure of claim 6, wherein said nonvolatile memory element is an EEPROM.

9. The fuse encoding structure of claim 6, wherein a nonvolatile memory element is a plurality of nonvolatile memory cells which are functionally connected in parallel with each other.

10. The fuse encoding structure of claim 6, wherein said nonvolatile memory element is functionally connected to a reading circuit.

11. The fuse encoding structure of claim 6, wherein said select-enable transistor is functionally connected to an enabling circuit for the reading of information stored in said nonvolatile memory element.

12. The fuse encoding structure of claim 6, wherein said select-enable transistor, said programming transistor, and said nonvolatile memory elements are MOS devices.

13. The fuse encoding structure of claim 6, wherein said programming transistor is functionally connected to a configuring line to receive data for storage in said nonvolatile memory element.

14. The fuse encoding structure of claim 6, wherein a reading voltage circuit maintains a read bias voltage on the control gate of said nonvolatile memory element.

15. A coding method comprising the steps of:
   forming an array of multibit registers each composed of a plurality of programmable nonvolatile memory cells;
   functionally connecting said programmable elementary cells of each register in an OR configuration to a common sensing line of the multibit register;
   associating a single reading circuit to each multibit register that has an input connected to the common sensing line;
   connecting a first select/enable bus to single elementary programmable cell of the same order of each multibit register at one time to the common sensing line of the respective register;
   connecting each wire of a second configuring bus to the current terminals of the programming transistors of all programmable elementary cells that compose each register; and
   connecting each wire of a third contingent programming bus to the gates of the programming transistors of the memory cells of the same order of the registers.

* * * * *